(12) United States Patent
Tounai

(10) Patent No.: US 6,174,633 B1
(45) Date of Patent: Jan. 16, 2001

(54) METHOD FOR CORRECTING PHOTOCONTIGUOUS EFFECT DURING MANUFACTURE OF SEMICONDUCTOR DEVICE

(75) Inventor: Keiichiro Tounai, Tokyo (JP)

(73) Assignee: NEC Corporation (JP)

( * ) Notice: Under 35 U.S.C. 154(b), the term of this patent shall be extended for 0 days.

(21) Appl. No.: 09/441,487

(22) Filed: Nov. 17, 1999

(30) Foreign Application Priority Data

Nov. 18, 1998 (JP) .................................................. 10-328080

(51) Int. Cl.$^7$ ........................................................ G03F 9/00
(52) U.S. Cl. ................................................................ 430/30
(58) Field of Search .................................. 430/5, 30, 296

(56) References Cited

U.S. PATENT DOCUMENTS

| | | | |
|---|---|---|---|
| 5,208,124 | 5/1993 | Sporon-Fieldler et al. | 430/5 |
| 5,804,339 | 9/1998 | Kim | 430/5 |

FOREIGN PATENT DOCUMENTS

| | | |
|---|---|---|
| 2189913 | 7/1990 | (JP) . |
| 580486 | 4/1993 | (JP) . |
| 8321450 | 12/1996 | (JP) . |
| 2616467 | 3/1997 | (JP) . |
| 10690583 | 3/1998 | (JP) . |
| 10104818 | 4/1998 | (JP) . |
| 10-239826 | 9/1998 | (JP) . |
| WO 97/45772 | 12/1997 | (WO) . |

OTHER PUBLICATIONS

"Automated Optical Proximity Correction—a Rules–Based Approch" Otto et al.
Optical/Laser Microlithography VII, vol. 2197, SPIE Symposium of Microlithography 1994; pp. 1–16.

Primary Examiner—Christopher G. Young
(74) Attorney, Agent, or Firm—Hayes, Soloway, Hennessey, Grossman & Hage, P.C.

(57) ABSTRACT

A method for correcting a photo-contiguous effect during manufacture of a semiconductor device comprising the steps of: designating a first peripheral region surrounding a first layer; locating at least a corner of a second layer belonging to the first peripheral region; forming a second peripheral region surrounding the corner; and adding the second peripheral region to the first layer is disclosed. The method can suppress not only increase of the data and of a period of time for correcting the photo-contiguous effect but also deterioration of resolution can be prevented.

10 Claims, 9 Drawing Sheets

METHOD FOR CORRECTING PHOTOCONTIGUOUS EFFECT DURING MANUFACTURE OF SEMICONDUCTOR DEVICE

BACKGROUND OF THE INVENTION (a) Field of the Invention

The present invention relates to a method for correcting a photo-contiguous effect during manufacture of a semiconductor device, more in detail, to the method for correcting the photo-contiguous effect, which prevents undesired reduction of a length of a pattern at a node where two layers are electrically connected.

(b) Description of the Related Art

In a photolithographic step used in the process for manufacturing a semiconductor device having miniaturized patterns, a photo-contiguous effect may occur which does not perform an accurate transfer of pattern due to photo-interference generated between rays contiguous with each other during an exposure step and a transfer step. Reduction of an error regarding pattern sizes generated by the photo-contiguous effect is required. The pattern size error can be reduced by correcting the photo-contiguous effect as described in JP-A-5(1993)-80486. The correction is conducted by modifying a projection of a pattern to be corrected by means of a calculation technique as described in JP-B-2616467.

When a line end of a circuit pattern such as an interconnect pattern and a gate pattern is connected to a connection node such as a plug and a via hole, a problem arises that the line end of the interconnect or the gate is reduced in length due to the photo-contiguous effect to decrease the connection area down to smaller than the design area, resulting in connection deficiency.

A conventional technique of modifying a mask pattern for canceling the reduction of the line end of the connection node is shown in FIG. 1.

In the conventional technique, a pair of additional patterns 102 and 103 having a projection "a" and a length "b" are provided at respective corners C1 and C2, of the end of an interconnect 101 in an interconnect pattern.

The projection "a" means the amount of projection of the side of the additional pattern with respect to the side of the corresponding side of the interconnect.

Such additional patterns 102 and 103 are also reduced due to the contiguous effect to achieve the interconnect 101 having the overall shape complying with the original design.

In the conventional technique as shown in FIG. 2, additional pattern 106 is also provided to each bent of non-connection node 105 having one free corner, in addition to the connection nodes 104 having plugs and two adjacent free corners. This modification or correction is also conducted to the nodes where the modification is unnecessary. The technique conducting the modification regardless of the existence of the plug significantly increases the size of the mask pattern data due to increase of the number of figures of the additional patterns. Further, the additional pattern having the same length of projection is added regardless of the length of the side of the connection nodes 104, increasing the amount of modification for the shorter side of the pattern to deteriorate the resolution at the shorter side.

FIG. 3 shows a known technique of correcting the photo-contiguous effect in connection of the length of the side. The technique adds an additional pattern 107 having projections "a" and "d" different from each other corresponding to widths W1 and W2 of both sides of the pattern 101 to be modified. Although the amount of the modification at the shorter side is not excessive in the technique, calculation of the projections for the both sides causes a problem that a long period of time is required for obtaining the projections.

Accordingly, a method for correcting the photo-contiguous effect is desired in which an amount of modification is appropriate, increase of a period of time for modifying a pattern is not so large, and the modification can be applied only to required nodes.

SUMMARY OF THE INVENTION

In view of the foregoing, an object of the present is to provide a method for correcting a photo-contiguous effect during manufacture of a semiconductor device, which does not significantly increase a period of time for modifying a pattern.

Another object of the present invention is to provide the method of which an amount of modification is appropriate.

A further object of the present invention is to provide the method in which the modification is applied only to required nodes.

The present invention provides a method for correcting a photo-contiguous effect during manufacturing a semiconductor device including the steps of: designating a first region specified by a first mask pattern of a first level mask; finding at least one corner from a second mask pattern in a second level mask belonging to said first region as viewed perpendicular to both said masks; locating a second region for surrounding said corner; and correcting said first mask pattern by adding said second region to said first region to form a corrected first mask pattern in said first level mask.

In accordance with the method for correcting the photo-contiguous effect of the present invention, since no correction to the second layer is conducted where the first layer does not exist, increase of the data and of a period of time for correcting the photo-contiguous effect can be suppressed. Additionally, deterioration of resolution can be prevented.

The above and other objects, features and advantages of the present invention will be more apparent from the following description.

PREFERRED EMBODIMENTS OF THE INVENTION

Now, the present invention is more specifically described with reference to accompanying drawings.

Techniques of preparing data for depicting a mask utilizing an interconnect pattern obtained by modifying a pre-modified interconnect pattern in layout data in accordance with embodiments of the present invention will be described.

At first, terms used herein are briefly described for a purpose of clear understanding and should not be restricted thereto.

A first layer is a square or circular connection layer such as a plug layer and a via hole layer. A second layer is a longer connection layer such as a gate layer and an interconnect layer. The plug layer and the via hole layer are electrically connected to the gate layer and the interconnect layer.

A first peripheral region may be that partially surrounding and in contact with the first layer in addition to a circular region wholly surrounding the first layer. Corners may be formed in the shape of an arc in addition to right angled inwardly bent lines.

A second peripheral region may be formed as a plurality of divided regions corresponding to a plurality of the corners or as a single region surrounding the plurality of the corners.

Figure 1:
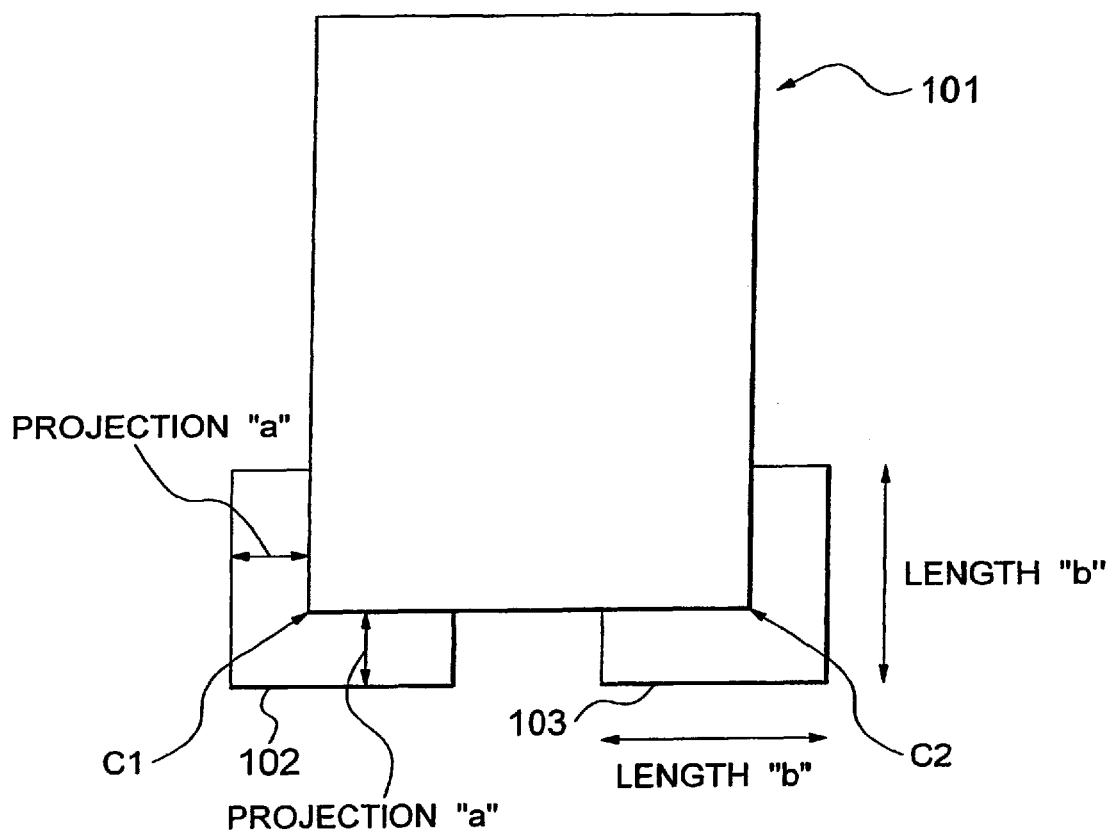
FIG. 1 is a schematic top plan view showing a conventional method for correcting a photo-contiguous effect during manufacture of a semiconductor device.
Figure 2:
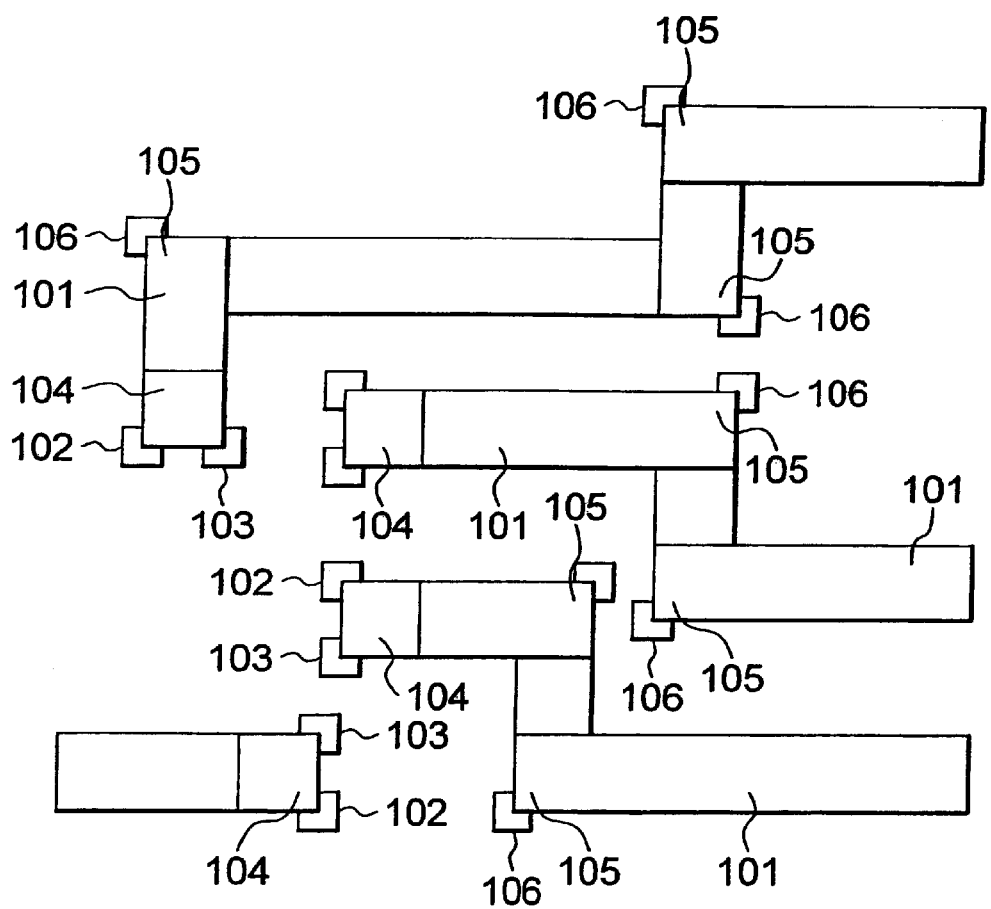
FIG. 2 is a schematic top plan view showing a layout of patterns to which the method of FIG. 1 may be applied.
Figure 3:
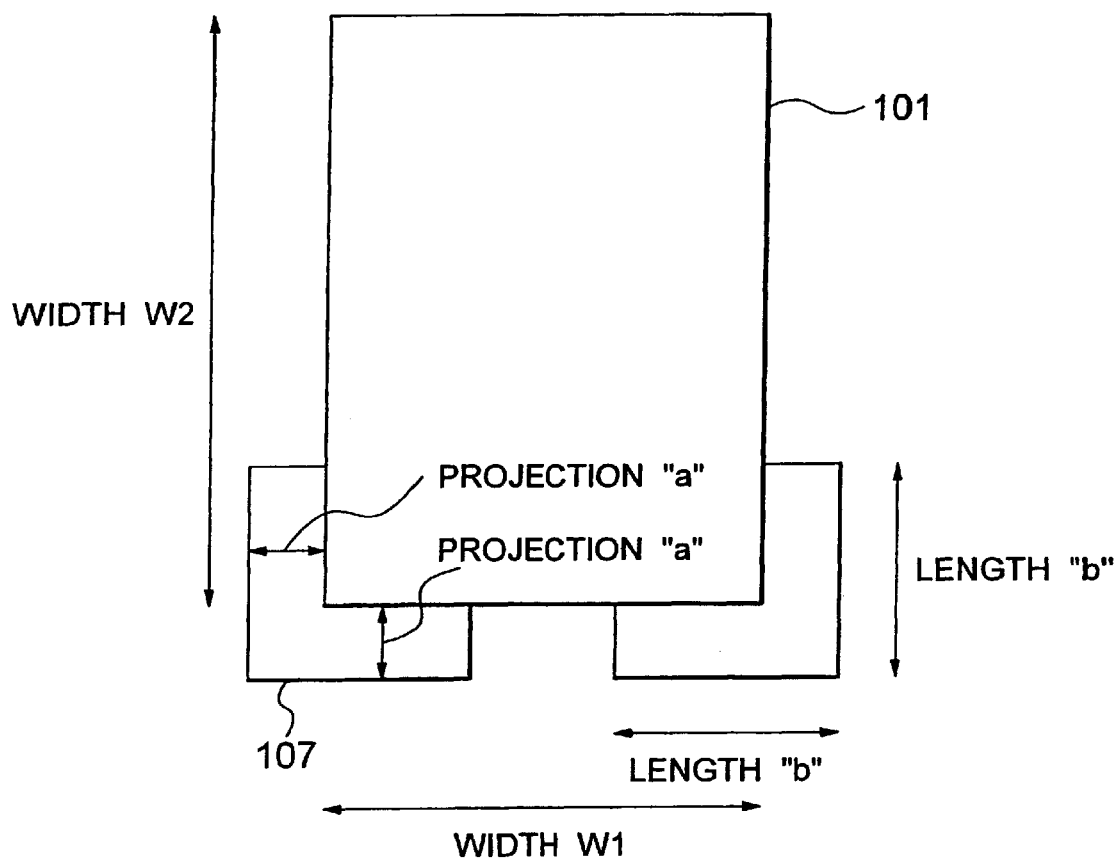
FIG. 3 is a schematic top plan view showing another conventional method for correcting the photo-contiguous effect.
Figure 4:
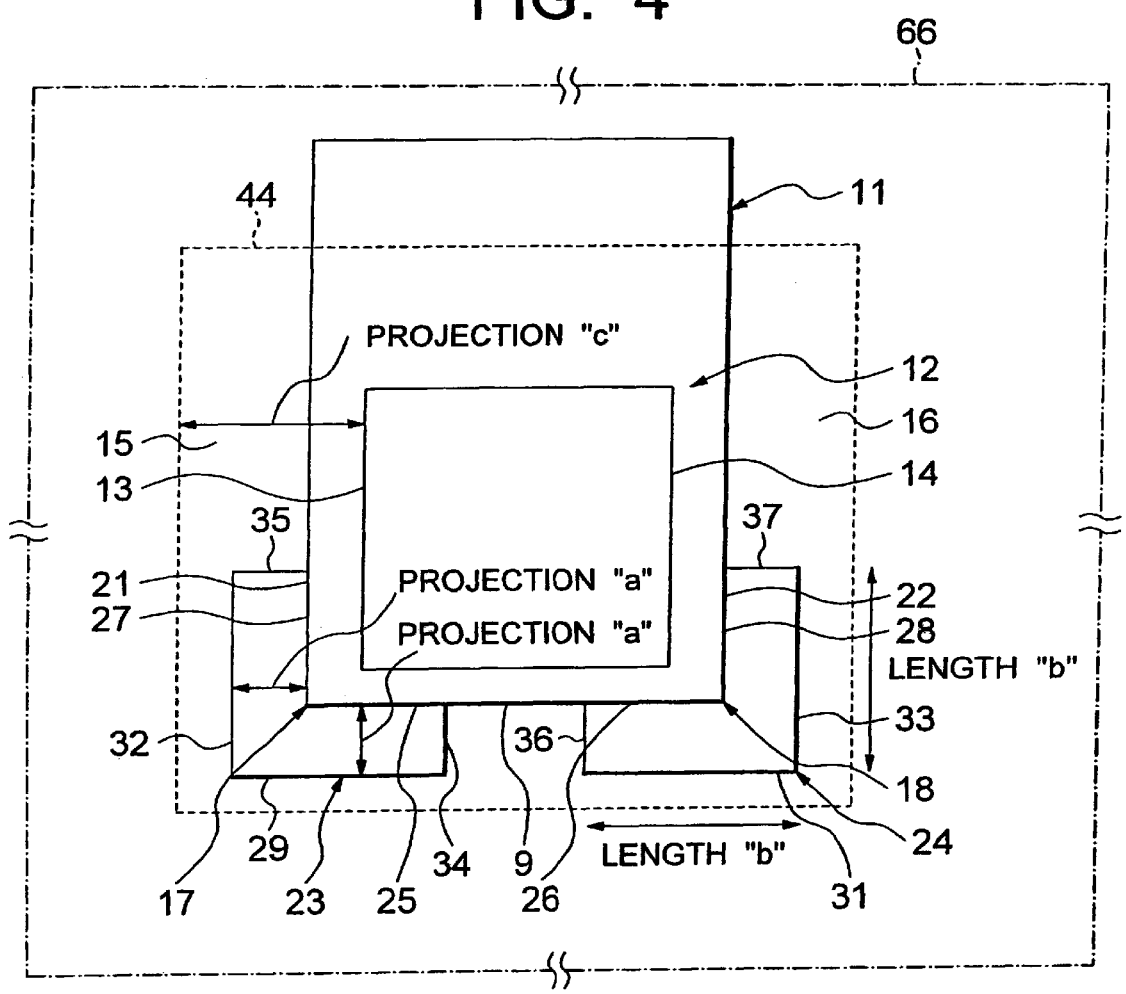
FIG. 4 is a schematic top plan view showing a method for correcting the photo-contiguous effect during manufacture of the semiconductor device in accordance with a first embodiment of the present invention.

In FIG. 4 showing a first embodiment of the present invention, a computer 66 stores layout data before modification. The layout data include an interconnect 11 in a first level mask which is an interconnect layer pattern or its component, and a plug 12 in a second level mask which is a plug layer pattern or its component. In a first step, regions 15 and 16 separated from specified linear sides 13 and 14 parallel to each other by a distance "c", respectively, are formed by the computer 66.

The computer 66 locates a first and a second corners 17 and 18 of the interconnect 11 contained in the regions 15 and 16, respectively, in a second step. The computer 66 regards a side formed between the first corner 17 and the second corner 18 as a terminal node of the interconnect 11 in a third step. The side is referred to as a standard side 19. The computer 66 establishes in the first level mask a corrected mask pattern having a first and a second additional regions 23 and 24 having projections "a" and lengths "b" in contact with the standard side 19 and one of the two adjacent sides 21 and 22 in a fourth step.

The standard side 19 of the rectangular interconnect 11 is disposed perpendicular to the adjacent sides 21 and 22.

The first and the second additional regions 23 and 24 are surrounded by first and second shorter side common line 25 and 26 sharing node of the standard line 19, first and second longer side common line 27 and 28 sharing node of the adjacent sides 21 and 22, first and second shorter side contour lines 29 and 31 parallel to the first and second shorter side common line 25 and 26 at a distance "a" therebetween, first and second longer side contour lines 32 and 33 parallel to the first and second longer side common line 27 and 28 at a distance "a" therebetween, and first and second both end lines 34, 35, 36 and 37.

The first and the second end lines 34 and 36 are disposed perpendicular to the standard line 19, and the other end lines 35 and 37 are disposed perpendicular to the first and second longer side common line 27 and 28, respectively. In other words, the first and the second additional regions 23 and 24 have right angled inwardly bent portions in contact with the first and the second corners 17 and 18 for surrounding the corners, respectively.

The computer 66 regards the first and the second additional regions 23 and 24 as additional interconnect nodes in a fifth step, and adds the additional interconnect nodes to the interconnect 11 for forming an additional interconnect pattern which is then stored in a post-modified layout data storing node (not shown) in the computer 66. The computer 66 forms data for depicting a mask from the additional interconnect pattern in a sixth step.

Figure 5:
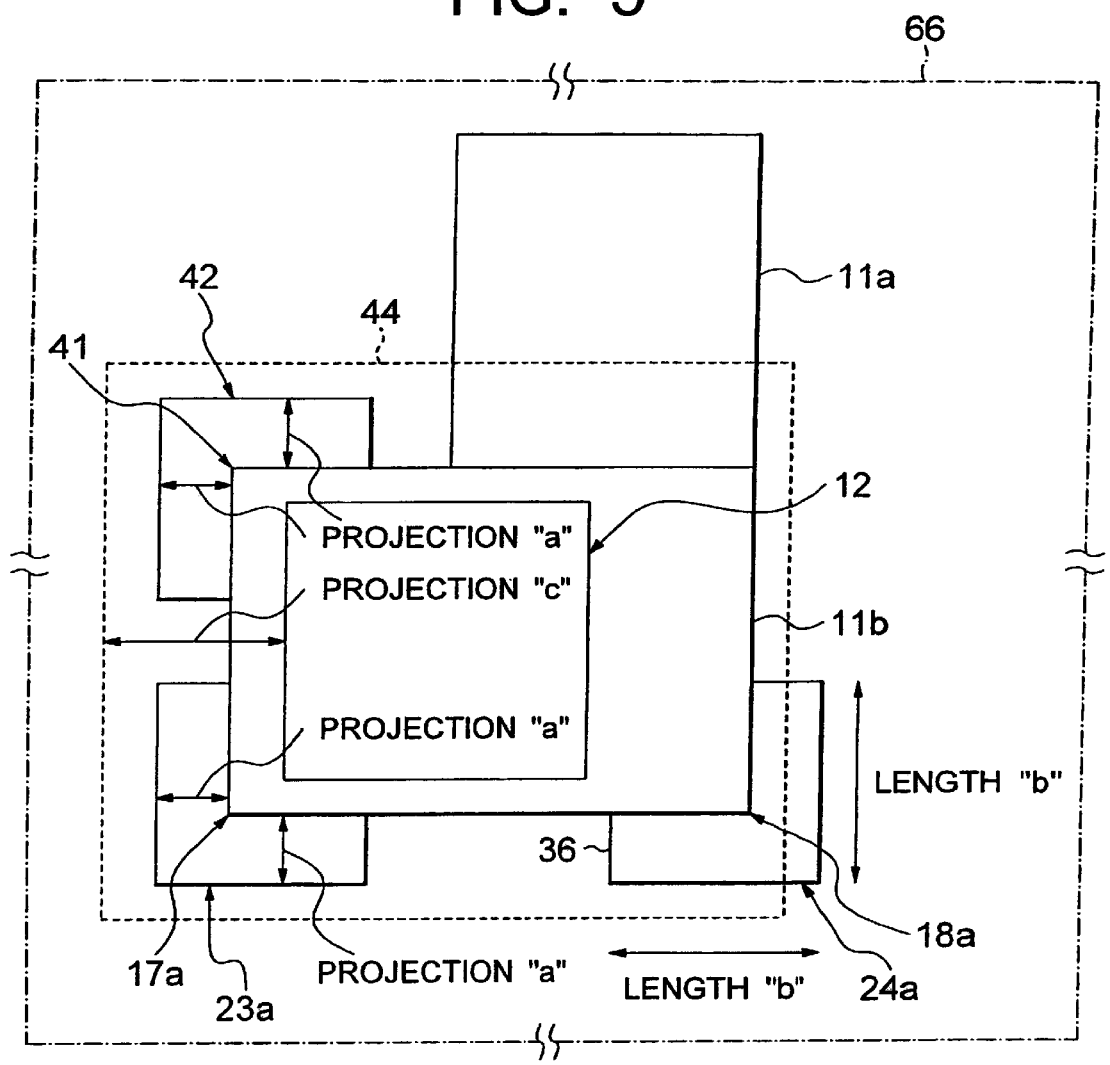
FIG. 5 is a schematic top plan view showing a second embodiment of the present invention.

In FIG. 5 showing a second embodiment of the present invention, an interconnect structure which is a component of an interconnect pattern to be modified includes an interconnect 11a and a plug interconnect 11b. A square region of a plug 12 is included in the region of the plug interconnect 11b. Since the projection of the interconnect 11a is smaller than the projection of the plug interconnect 11b, a third corner 41 is formed in addition to first and second corners 17a and 18a. A first additional region 23a corresponding to the first corner 17a and a second additional region 24a corresponding to the second corner 18a are formed in steps similar to the first to the fourth steps of the first embodiment shown in FIG. 4.

The computer 66 regards the first and the second additional regions 23a and 24a as additional interconnect nodes in a fifth step, and adds the additional interconnect nodes to the interconnect 11b for forming an additional interconnect pattern which is then stored in a post-modified layout data storing node (not shown) in the computer 66. The computer 66 forms data for depicting a mask from the additional interconnect pattern in a sixth step.

An additional region 42 corresponding to the third corner 41 is also formed in steps similar to the first to the fourth steps. Data for depicting a mask corresponding to the third corner 41 is also formed in steps similar to the fifth and the sixth steps. In this manner, the interconnect 11b complying with an original design is transferred and formed by the reduction of the three additional interconnect regions surrounding the three corners by means of the photo-contiguous effect.

Figure 6:
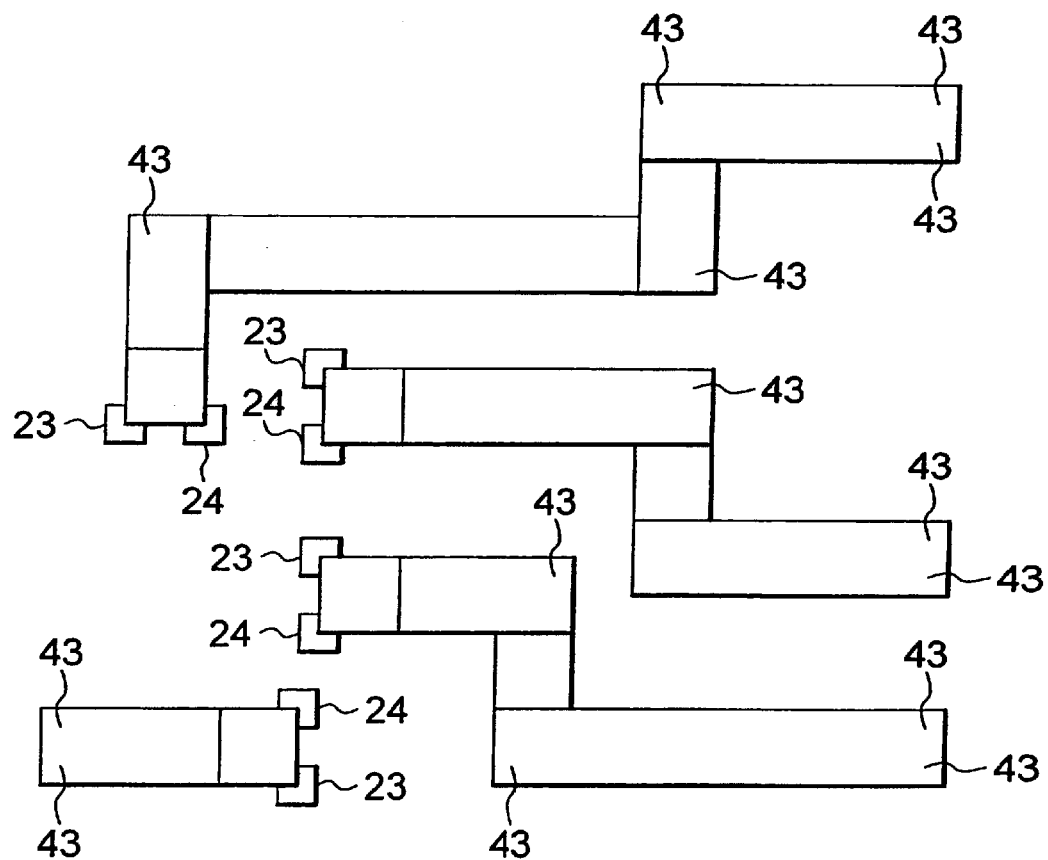
FIG. 6 is a schematic top plan view showing a layout of patterns to which the method of the second embodiment may be applied.

Since the above-described first step in which the region separated from the parallel specified linear sides by the distance "c" is formed in the computer, and the above-described second step in which the computer locates the plurality of the corners of the interconnect included in the above region are conducted only to the corners in a rectangular contour region 44 having a projection "c" which surrounds the square plug for correcting the photo-contiguous effect, the correction therefor is not exerted on a plurality of corners 43 of the interconnect having no plugs as shown in FIG. 6. In this manner, the increase of the make data size can be suppressed.

Figure 7:
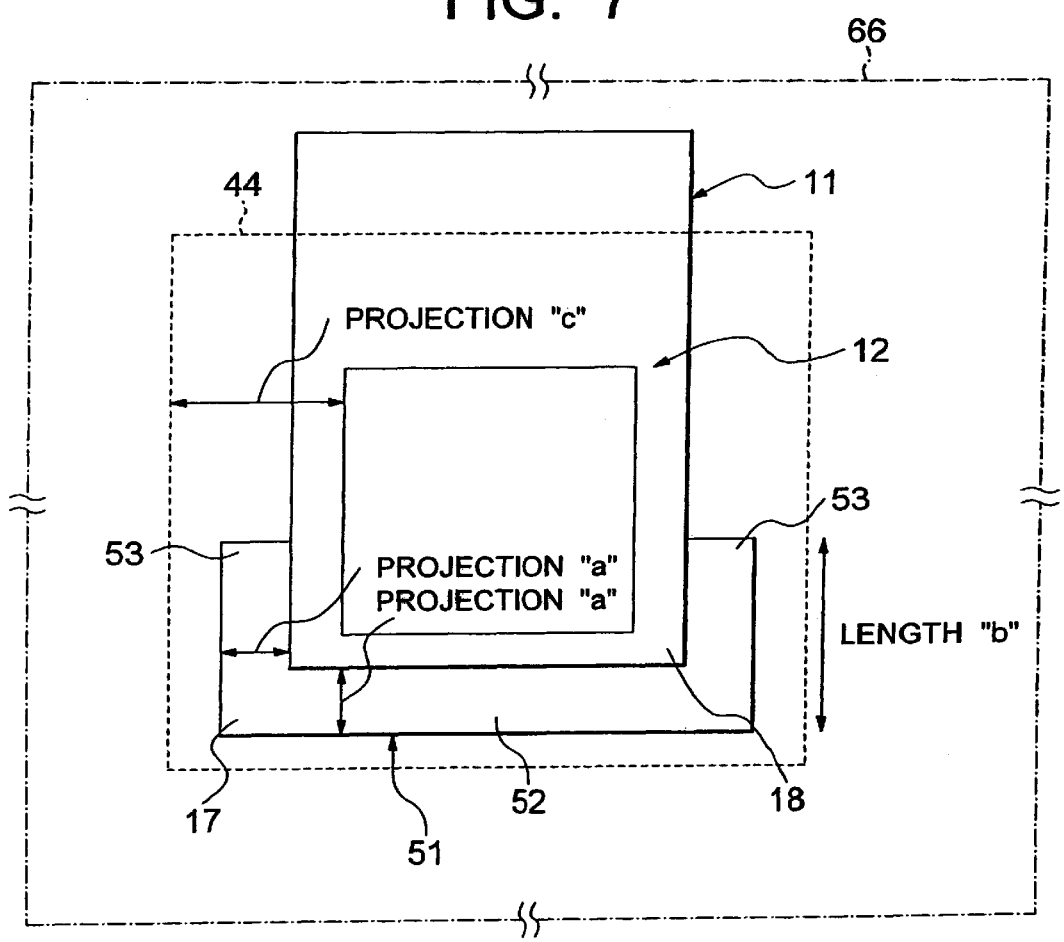
FIG. 7 is a schematic top plan view showing a third embodiment of the present invention.

In FIG. 7 showing a third embodiment of the present invention, a rectangular contour region 44 surrounding a plug 12 is similarly formed by a computer 66. A step for locating corners 17 and 18 in the rectangular contour region 44 is similar to the above second step. The third embodiment is different from the preceding embodiments in that an additional region 51 surrounding the corners 17 and 18 is a single element.

The additional region 51 includes a single shorter side additional region 52 and longer side additional regions 53 in contact with the both sides of the shorter side additional region 52. The shorter side additional region 52 and the longer side additional regions 53 have the same length of projections "a".

The computer 66 regards the single additional region 51 as an additional interconnect node in a fifth step, and adds the additional interconnect node to the interconnect 11 for forming an additional interconnect pattern which is then stored in a post-modified layout data storing node in the computer 66. The computer 66 forms data for depicting a mask from the additional interconnect pattern in a sixth step.

Figure 8:
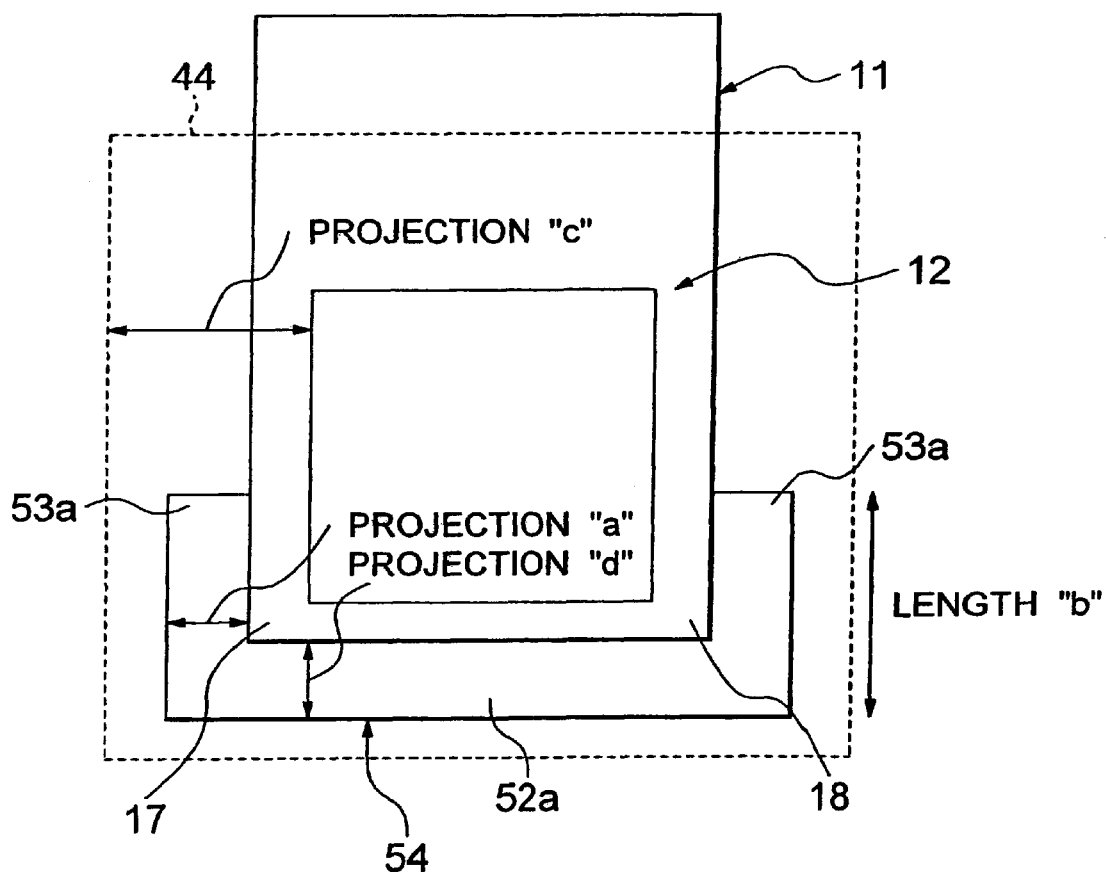
FIG. 8 is a schematic top plan view showing a fourth embodiment of the present invention.

In FIG. 8 showing a fourth embodiment of the present invention which is substantially same as the third embodiment except that a projection "a" of a single longer side additional region 53a of a single additional region 54, which is substantially the same as the projection "a" of the third embodiment, is smaller than a projection "b" of a single shorter side additional region 52a. The projections "a" and "b" are determined in accordance with degrees of reduction of lengths due to the photo-contiguous effect which are influenced by a density of patterns and a distance between scattered nodes.

Figure 9:
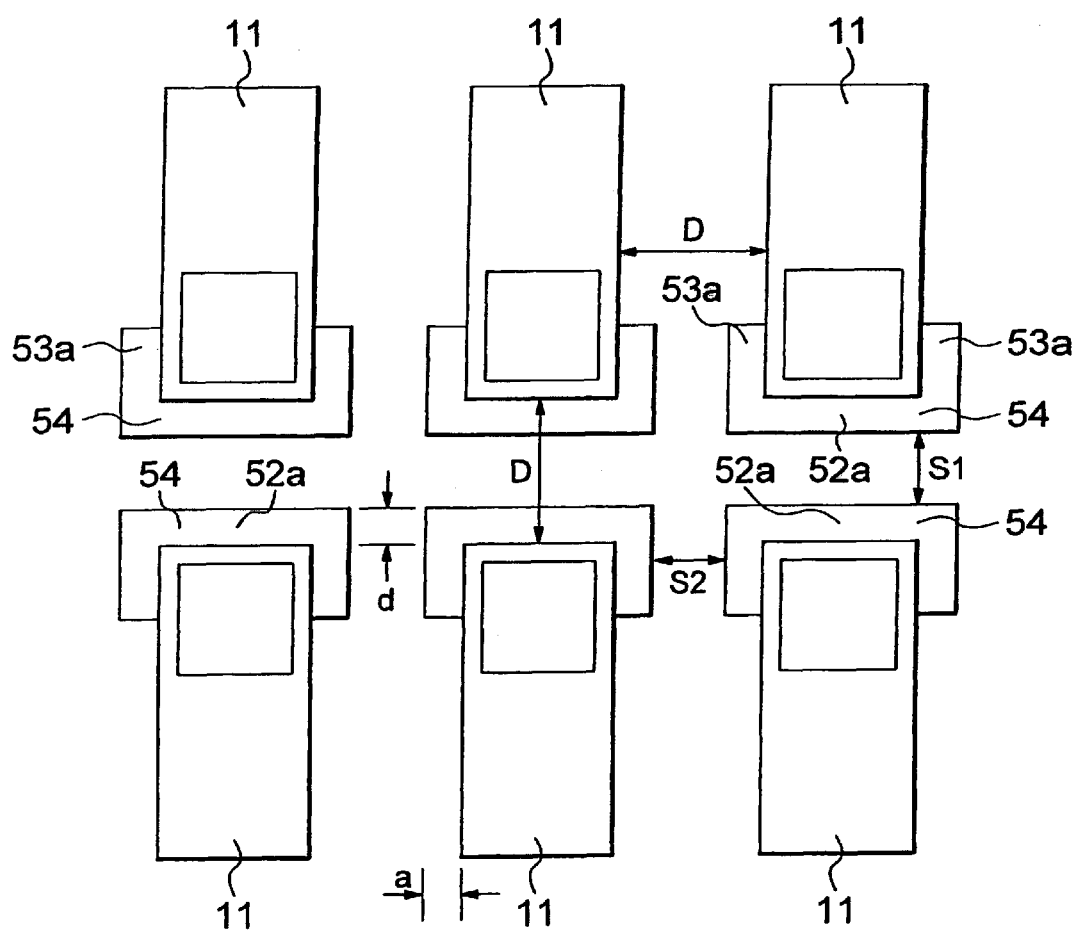
FIG. 9 is a schematic top plan view showing a fifth embodiment of the present invention.

A process of overcoming a problem arising from the high density of the patterns is shown in FIG. 9 as a fifth embodiment. In this embodiment, the standard side and the adjacent sides described in the first embodiment are referred to as a shorter side and a longer side, respectively. A distance "D" between adjacent longer sides of interconnects 11 and a distance "D" between adjacent shorter sides of interconnects 11 before correction are substantially the same, and are designed to have the minimum value.

A projection "d" of a single shorter side additional region 52a is smaller than a projection "a" of a longer side additional region 53a. Accordingly, a projection "S1" between the adjacent shorter side additional regions after the correction is broader than a projection "S2" between the adjacent longer side additional regions after the correction. By adjusting the distance between the regions in this manner, the deterioration of the resolution of the shorter side space of the pattern compared with that of the longer side space can be prevented. The unification of the additional regions does not increase a period of time for correcting the pattern without obtaining the respective length values of the additional pattern because projections of the respective sides of the additional pattern are changed.

Since the above embodiments are described only for examples, the present invention is not limited to the above embodiments and various modifications or alternations can be easily made therefrom by those skilled in the art without departing from the scope of the present invention.

What is claimed is:

1. A method for correcting a photo-contiguous effect during manufacturing a semiconductor device comprising the steps of:

designating a first region specified by a first mask pattern of a first level mask;

finding at least one corner of a second layer from a second mask pattern in a second level mask belonging to said first region as viewed perpendicular to both said masks;

locating a second region for surrounding said corner; and correcting said first mask pattern by adding said second region to said first region to form a corrected first mask pattern in said first level mask.

2. The method of correcting the photo-contiguous effect as defined in claim 1, wherein the first layer is a first electrical connection layer, and the second layer is a second electrical connection layer.

3. The method of correcting the photo-contiguous effect as defined in claim 2, wherein the first electrical connection layer is a plug layer, and the second electrical connection layer is an interconnect layer.

4. The method of correcting the photo-contiguous effect as defined in claim 2, wherein the first electrical connection layer is a plug layer, and the second electrical connection layer is a gate layer.

5. The method of correcting the photo-contiguous effect as defined in claim 1, wherein the first peripheral region is a circular region surrounding all the first layer.

6. The method of correcting the photo-contiguous effect as defined in claim 1, wherein when a plurality of the corners exist at an end of the second layer, the second peripheral region is formed as a plurality of regions corresponding to the respective corners.

7. The method of correcting the photo-contiguous effect as defined in claim 1, wherein when a plurality of the corners exist at an end of the second layer, the second peripheral region is formed as a single region surrounding the plurality of the corners.

8. The method of correcting the photo-contiguous effect as defined in claim 1, wherein the second peripheral region includes a shorter side additional region parallel to a shorter terminal side of the second layer and a longer side additional region adjacent to the shorter terminal side, and a projection "d" of the shorter side additional region is different from a projection "a" of the longer side additional region.

9. The method of correcting the photo-contiguous effect as defined in claim 8, wherein the projection "d" is smaller than the projection "a".

10. The method of correcting the photo-contiguous effect as defined in claim 9, wherein when a plurality of the corners exist at an end of the second layer, the second peripheral region is formed as a single region surrounding the plurality of the corners.

\* \* \* \* \*